(12) United States Patent
Paik

(10) Patent No.: US 7,413,986 B2
(45) Date of Patent: Aug. 19, 2008

(54) FEEDFORWARD AND FEEDBACK CONTROL FOR CONDITIONING OF CHEMICAL MECHANICAL POLISHING PAD

(75) Inventor: Young Joseph Paik, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/220,010

(22) Filed: Sep. 6, 2005

(65) Prior Publication Data
US 2006/0009129 A1 Jan. 12, 2006

Related U.S. Application Data

(62) Division of application No. 09/998,384, filed on Nov. 30, 2001, now Pat. No. 7,101,799.

(60) Provisional application No. 60/298,878, filed on Jun. 19, 2001, provisional application No. 60/305,782, filed on Jul. 16, 2001, provisional application No. 60/318,741, filed on Sep. 12, 2001.

(51) Int. Cl.
    *H01L 21/302* (2006.01)
(52) U.S. Cl. .................. 438/690; 451/21
(58) Field of Classification Search .......... 438/691, 438/692, 689, 690; 700/97, 121, 164; 451/5, 451/28, 463, 11, 21
    See application file for complete search history.

(56) References Cited

U.S. PATENT DOCUMENTS 5,456,627 A * 10/1995 Jackson et al. ............ 451/11
5,461,007 A * 10/1995 Kobayashi ................ 438/16
5,486,129 A    1/1996 Sandhu et al.
5,486,131 A * 1/1996 Cesna et al. .............. 451/56

(Continued)

FOREIGN PATENT DOCUMENTS

JP    410277930    10/1998

(Continued)

OTHER PUBLICATIONS

Dec. 12, 2005. Notice of Allowance from U.S. Appl. No. 11/118,711.

(Continued)

*Primary Examiner*—W. David Coleman
*Assistant Examiner*—Khiem D. Nguyen
(74) *Attorney, Agent, or Firm*—Blakely, Sokoloff, Taylor and Zafman

(57) ABSTRACT

A method, apparatus and medium of conditioning a planarizing surface includes installing a wafer to be polished in a chemical mechanical polishing (CMP) apparatus having a polishing pad and a conditioning disk, polishing the wafer under a first set of pad conditioning parameters selected to maintain wafer material removal rates with preselected minimum and maximum removal rates, determining a wafer material removal rate occurring during the polishing step, calculating updated pad conditioning parameters to maintain wafer material removal rates within the maximum and minimum removal rates, and conditioning the polishing pad using the updated pad conditioning parameters, wherein the updated pad conditioning parameters are calculated using a pad wear and conditioning model that predicts the wafer material removal rate of the polishing pad based upon pad conditioning parameters, such as the conditioning down force and rotational speed of the conditioning disk.

21 Claims, 13 Drawing Sheets

U.S. PATENT DOCUMENTS

| | | | |
|---|---|---|---|
| 5,637,031 A | 6/1997 | Chen | |
| 5,639,388 A | 6/1997 | Kimura et al. | |
| 5,655,951 A * | 8/1997 | Meikle et al. | 451/56 |
| 5,698,455 A | 12/1997 | Meikle et al. | |
| 5,743,784 A | 4/1998 | Birang et al. | |
| 5,785,585 A | 7/1998 | Manfredi et al. | |
| 5,904,608 A | 5/1999 | Watanabe | |
| 5,904,609 A | 5/1999 | Fukuroda et al. | |
| 5,934,974 A | 8/1999 | Tzeng | |
| 5,975,994 A * | 11/1999 | Sandhu et al. | 451/56 |
| 6,135,863 A | 10/2000 | Zhang et al. | |
| 6,149,505 A | 11/2000 | Brown et al. | |
| 6,169,931 B1 * | 1/2001 | Runnels | 700/97 |
| 6,172,756 B1 * | 1/2001 | Chalmers et al. | 356/630 |
| 6,186,864 B1 * | 2/2001 | Fisher et al. | 451/6 |
| 6,227,955 B1 | 5/2001 | Custer et al. | |
| 6,306,008 B1 * | 10/2001 | Moore | 451/5 |
| 6,652,355 B2 * | 11/2003 | Wiswesser et al. | 451/6 |
| 6,897,079 B2 | 5/2005 | Hirose et al. | |
| 6,969,297 B2 | 11/2005 | Moore | |
| 7,040,956 B2 * | 5/2006 | Paik | 451/5 |
| 2001/0000773 A1 | 5/2001 | Campbell et al. | |

FOREIGN PATENT DOCUMENTS

| | | |
|---|---|---|
| JP | 2002 124496 | 4/2002 |
| JP | 2002-126998 | 5/2002 |
| JP | 2002-280337 | 9/2002 |
| JP | 2002-299289 | 10/2002 |
| WO | WO 9624839 | 8/1996 |

OTHER PUBLICATIONS

Jan. 26, 2006. Notice of Allowance for U.S. Appl. No. 09/998,384.

* cited by examiner

US 7,413,986 B2

FEEDFORWARD AND FEEDBACK CONTROL FOR CONDITIONING OF CHEMICAL MECHANICAL POLISHING PAD

CROSS REFERENCE TO RELATED APPLICATIONS

This application is a division of U.S. patent application Ser. No. 09/998,384 filed Nov. 30, 2001, now U.S. Pat. No. 7,101, 799, and entitled Feedforward and Feedback Control for Conditioning of Chemical Mechanical Polishing Pad which claims priority to the following U.S. Provisional Patent Applications:

60/298,878 filed Jun. 19, 2001 and entitled Advanced Process Control for Semiconductor Manufacturing Process;

60/305,782, filed Jul. 16, 2001 and entitled Feedforward and Feedback Control for Conditioning of Chemical Mechanical Polishing Pad; and 60/318,741, filed Sep. 12, 2001 and entitled Feedforward and Feedback Control for Conditioning of Chemical Mechanical Polishing Pad.

FIELD OF THE INVENTION

The present invention generally relates to the area of polishing and methods for improving the life of polishing pads.

BACKGROUND OF THE INVENTION

Chemical-mechanical polishing (CMP) is used in semiconductor fabrication processes for obtaining full planarization of a semiconductor wafer. The method involves removing material (e.g., a sacrificial layer of surface material) from the wafer, (typically silicon dioxide ($SiO_2$)) using mechanical contact and chemical erosion from (e.g., a moving polishing pad saturated with slurry). Polishing flattens out height differences, since areas of high topography (hills) are removed faster than areas of low topography (valleys). FIG. 1A shows a top view of a CMP machine 100 and FIG. 1B shows a side section view of the CMP machine 100 taken through line AA. The CMP machine 100 is fed wafers to be polished. Typically, the CMP machine 100 picks up a wafer 105 with an arm 101 and places it onto a rotating polishing pad 102. The polishing pad 102 is made of a resilient material and is often textured, to aid the polishing process. The polishing pad 102 rotates on a platen 104 or turn table located beneath the polishing pad 102 at a predetermined speed. The wafer 105 is held in place on the polishing pad 102 by the arm 101. The lower surface of the wafer 105 rests against the polishing pad 102. The upper surface of the wafer 105 is against the lower surface of the wafer carrier 106 of arm 101. As the polishing pad 102 rotates, the arm 101 rotates the wafer 105 at a predetermined rate. The arm 101 forces the wafer 105 into the polishing pad 102 with a predetermined amount of down force. The CMP machine 100 also includes a slurry dispense arm 107 extending across the radius of the polishing pad 102. The slurry dispense arm 107 dispenses a flow of slurry onto the polishing pad 102.

It is known that the material removal rate provided by a given polishing pad decreases exponentially with time in the manner shown in FIG. 2. As a consequence, the polishing pad must be conditioned (e.g., using a conditioning disk 108), between polishing cycles. Doing so roughens the surface of the pad and restores, at least temporarily, its original material removal rate. When the pad can no longer be reconditioned, it is replaced.

A problem with conventional conditioning methods is that they may over condition, e.g., wear out, the planarizing surface, and thus may reduce the pad life of the polishing pads. Because of variation in material removal rates from pad to pad, the CMP tool must be recalibrated to achieve a desired material removal rate each time a pad is changed. The production time lost during pad changes translates into processing delays and lost efficiency.

In an attempt to extend the life of the pad, various methods are reported for selectively conditioning a polishing pad, and for varying the down force of the conditioning element (e.g., conditioning disk 108) along the surface of the CMP pad based upon the likely or perceived distribution of unacceptable pad conditions across the planarizing surface. Other methods report varying the conditioning recipe across the surface of the polishing pad in response to polishing pad non-uniformities. However, these reported CMP processes are typically more concerned with improving the CMP process, e.g., improving within water non-uniformity, than in extending pad life.

Methods and devices that would extend pad life and therefore reduce the frequency of pad replacement offer significant cost savings to the wafer fabrication process.

SUMMARY OF THE INVENTION

The present invention relates to a method, apparatus and medium for conditioning a planarizing surface of a polishing pad in order to extend the working life of the pad. The present invention uses physical and chemical models (which can be implemented as a single model or multiple models) of the pad wear and planarization processes to predict polishing pad performance and to extend pad life. This results in an increase in the number of semiconductor wafer or other substrates that can be polished with a single polishing pad, thereby providing significant cost savings in the CMP process, both in reducing the number of pads needed and the time devoted to pad replacement.

The model predicts polishing effectiveness (wafer material removal rate) based on the "conditioning" operating parameters of the conditioning process. In at least some embodiments of the present invention, conditioning parameters include pressure (conditioning disk down force) and velocity (rotational speed of the conditioning disk), and can also include other factors, such as the frequency of conditioning, duration of conditioning and translational speed of conditioning disk across the pad surface. The model selects, and then maintains, polishing pad conditioning parameters within a range that does not overcondition the pad while providing acceptable wafer material removal rates. Thus the present invention provides a process for the feedforward and feedbackward control of the CMP polishing process. Although the invention is described herein with respect to the use of a disk, having an abrading of surface thereon, which is pushed against and moved with respect the pad, the techniques of the invention may be applied to other conditioning mechanisms.

In one aspect of the invention, a method of conditioning a planarizing surface is provided in a chemical mechanical polishing (CMP) apparatus having a polishing pad against which a wafer is positioned for removal of material therefrom and a conditioning disk is positioned for conditioning of the polishing pad. The method includes providing a pad wear and conditioning model that defines wafer material removal rate as a function of at least one pad conditioning parameters, said at least one conditioning parameter having maximum and minimum values, polishing a wafer in the CMP apparatus under a first set of pad conditioning parameters selected to maintain wafer material removal rates within preselected minimum and maximum removal rates, determining a wafer material removal rate occurring during said polishing step, calculating updated pad conditioning parameters based upon said determined wafer material removal rate of said step (c) and the pad wear and conditioning model to maintain wafer material removal rates within the maximum and minimum removal rates, and conditioning the polishing pad using the updated conditioning parameters.

In at least some embodiments, the method includes polishing a wafer in the CMP apparatus under a first set of pad conditioning parameters selected to maintain wafer material removal rates within preselected minimum and maximum removal rates (which conditioning occurs simultaneously with polishing in at least some embodiments of the present invention); determining a wafer material removal rate occurring during the polishing step; calculating, based upon the wafer material removal rate, updated pad conditioning parameters to maintain wafer material removal rates within the maximum and minimum removal rates; and conditioning the polishing pad using the updated pad conditioning parameters. In at least some embodiments the polishing step includes polishing of a wafer or it includes polishing of two or more wafers, i.e. a polishing cycle. The wafer material removal rates can be averaged or the last polished wafer material removal rate can be used in updating pad conditioning parameters.

The updated pad conditioning parameters are calculated using a pad wear and conditioning model by determining wafer material removal rate as a function of pad conditioning parameters including conditioning disk down force and velocity of the conditioning disk; and determining the difference between the calculated and measured wafer material removal rates and calculating updated pad conditioning parameters to reduce said difference, wherein the updated pad conditioning parameters are updated according to the equation, $k=(k_1)+g*(k-(k_1))$, where k is a measured wafer material removal rate, $k_1$ is a calculated wafer material removal rate, g is the estimate gain, and $(k-(k_1))$ is the prediction error.

In at least some embodiments, the first set of pad conditioning parameters are determined empirically, or using historical data, or using the results of the design of experiment (DOE), a set of experiments used to define the model.

In at least some embodiments, the pad conditioning parameters of the pad wear and conditioning model includes frequency of conditioning, or time of conditioning, or the translational speed (a speed of motion of the disk other than disk rotation) of the conditioning disk during conditioning.

In at least some embodiments, wafer material removal rate includes measuring the wafer thickness before and after polishing. Calculating updated pad conditioning may include executing a recursive optimization process.

In at least some embodiments, the gain, g, is a value used to indicate the variability or reliability in the measured parameter.

In at least some embodiments, pad life is defined according to the relationship:

$$\text{PadLife} = f(F_{disk}, \omega_{disk}, t_{conditioning}, f, T_2),$$

where $F_{disk}$ is the down force applied by the conditioning disk to the CMP pad during conditioning, $\omega_{disk}$ is the angular velocity of the conditioning disk during conditioning of the polishing pad, t is the duration of conditioning, f is the frequency of condition and $T_2$ is the sweep speed of the conditioning disk during conditioning.

In at least some embodiments, the wafer material removal rate is defined by the equation $$\text{RemovalRate}]_{min}^{max} = f(F_{disk}]_{min}^{max}, \omega_{disk}]_{min}^{max}, f]_{min}^{max}, t_{conditioning}]_{min}^{max}, T_2]_{min}^{max}),$$

where $F_{disk}$ is the down force applied by the conditioning disk to the CMP pad during conditioning, $\omega_{disk}$ is the angular velocity of the conditioning disk during conditioning of the polishing pad, t is the duration of conditioning, f is the frequency of condition, and $T_2$ is the sweep speed of the conditioning disk during conditioning. In at least some embodiments, the maximum value for wafer material removal rate is the saturation point of the wafer material removal rate vs. conditioning down force curve i.e., where increases in down force do not affect removal rate. In at least some embodiments, the minimum value for wafer material removal rate and hence minimum acceptable conditioning parameters is defined by the maximum acceptable wafer polishing time.

In at least some embodiments, the wafer material removal rate is determined according to the equation:

$$\hat{y}_i = \rho_i x_i + I_i,$$

where $\hat{y}_i$ is the wafer material removal rate for a conditioning parameter $x_i$, $\rho_i$ is the slope and $I_i$ is the intercept of the curve of the defining the relationship between $\hat{y}_i$ and $x_i$ where other factors that may affect wafer polishing are held constant.

In at least some embodiments, an updated pad conditioning parameter, $x_{i+}$, is determined by solving the equation:

$$x_{i+} = \frac{\hat{y}_{i+} - I_i - \frac{W_i}{W_T} \cdot \Delta \hat{y}}{\rho_i},$$

where $\hat{y}_{i+}$ is the target wafer material removal rate, $W_i$ is the weighing factor for conditioning parameter $x_i$, and $\Delta y$ is the prediction error for wafer material removal rate.

In at least some aspects of the invention, an apparatus for conditioning polishing pads used to planarize substrates by removal of material therefrom includes a carrier assembly having an arm positionable over a planarizing surface of a polishing pad; a conditioning disk attached to the carrier assembly; and an actuator capable of controlling an operating parameter of the conditioning disk; a controller operatively coupled to the actuator, the controller operating the actuator to adjust the operating parameter of the conditioning disk as a function of a pad wear and conditioning model that predicts the wafer material removal rate of the polishing pad based upon polishing pad and wafer parameters. The conditioning down force and rotational speed of the conditioning disk is predicted by a model by determining wafer material removal rate as a function of pad conditioning parameters including conditioning disk down force and conditioning disk rotation rate.

In at least some embodiments, the wafer material removal rate is determined according to the equation:

$$\hat{y}_i = \rho_i x_i + I_i,$$

where $\hat{y}_i$ is the wafer material removal rate for a conditioning parameter $x_i$, $\rho_i$, is the slope and $I_i$ is the intercept of the curve of the defining the relationship between $\hat{y}_i$ and $x_i$.

In at least some embodiments, the updated pad conditioning parameter, $x_{i+}$, is determined by solving the equation:

$$x_{i+} = \frac{\hat{y}_{i+} - I_i - \frac{W_i}{W_T} \cdot \Delta \hat{y}}{\rho_i},$$

where $\hat{y}_{i+}$ is the target wafer material removal rate, $W_i$ is the weighing factor for conditioning parameter $x_i$, and $\Delta y$ is the prediction error for wafer material removal rate.

Thus, polishing pad life is extended by using a more desirable conditioning disk down force and angular velocity while keeping within the acceptable range of wafer material removal rate and by adjusting the conditioning parameters whenever the removal rate drops below the acceptable removal rate. By applying a "one size fits all" approach to pad conditioning parameters (e.g., by determining conditioning parameters without accounting for a change in actual wafer material removal rates), conventional processes overcompensate, thereby removing more pad material than is necessary and accelerating pad wear. The invention thus provides more optimal conditioning parameters, i.e., only those forces necessary to recondition the damaged pad.

BRIEF DESCRIPTION OF THE FIGURES

Various objects, features, and advantages of the present invention can be more fully appreciated with reference to the following detailed description of the invention when considered in connection with the following drawings.

FIG. 1A shows a top plan view of a conventional CMP machine. FIG. 1B shows a side sectional view of the prior art CMP machine from FIG. 1A taken through line A-A.

FIG. 3A generally shows the chemical structure of a polyurethane polishing pad and the ionic bonds that form between NCO groups. FIG. 3B generally shows how water forms ionic bonds with the polyurethane polishing pad by breaking down the ionic bonds between the NCO groups in the polyurethane composition. FIG. 3C generally shows how a silicon slurry forms hydrogen bonds with the water and the polyurethane polishing pad.

FIG. 4A is a diagram of a new polishing pad. FIG. 4B is a diagram of an old polishing pad. FIG. 4C shows how an old polishing pad can be refurbished for continued use.

DETAILED DESCRIPTION OF THE INVENTION

Novel methods for feedforward and feedback controls of the CMP process for maximizing the life of the polishing pad are described herein. Extended pad life results in reduced down time for the CMP process because the polishing pad can polish more wafers over a longer period of time without requiring replacement or adjustment (e.g., removal of the pad). The term wafer is used in a general sense to include any substantially planar object that is subject to polishing. Wafers include, in additional to monolith structures, substrates having one or more layers or thin films deposited thereon.

Figure 1A:
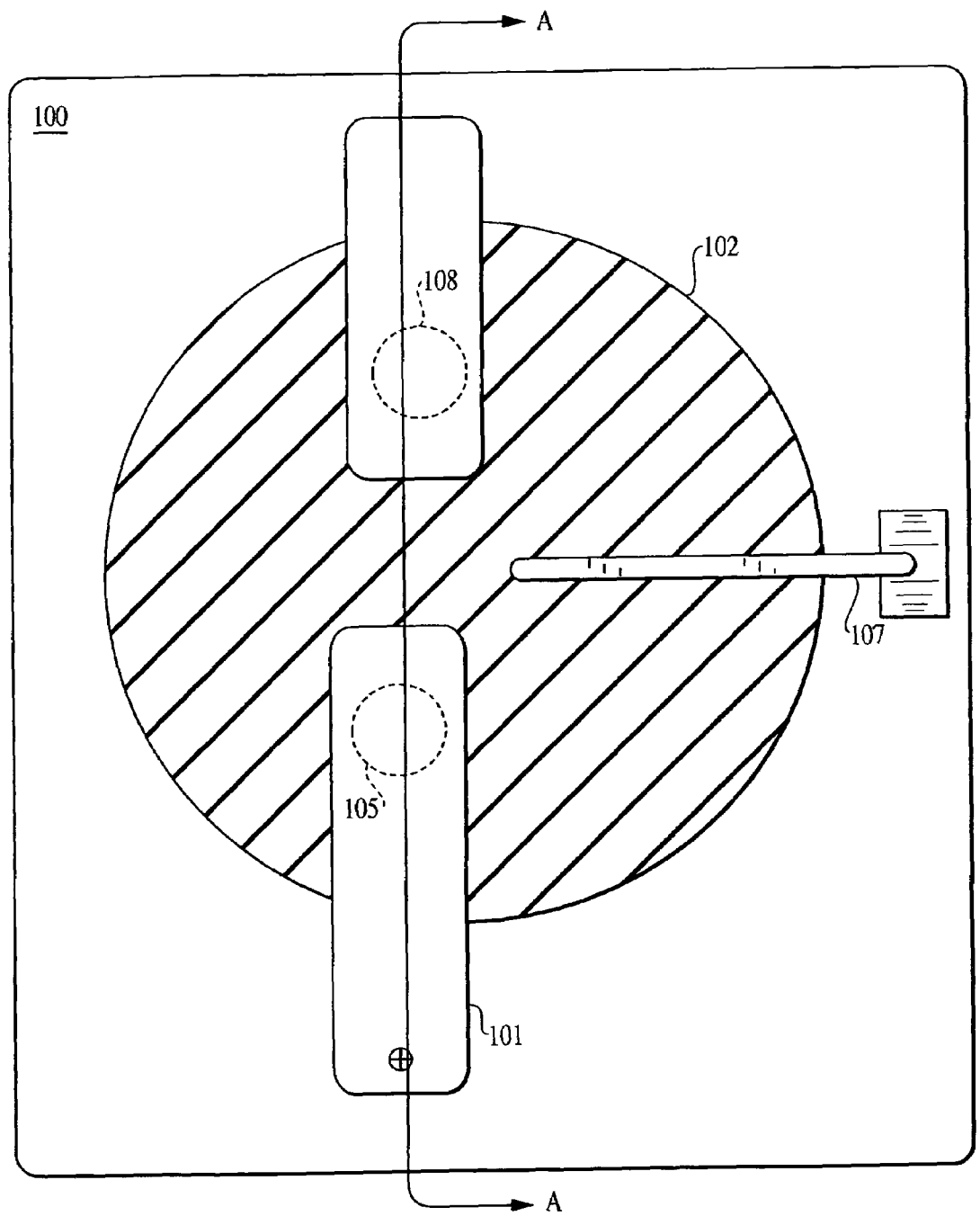
FIGS. 1A-B show a conventional CMP machine.
Figure 1B:
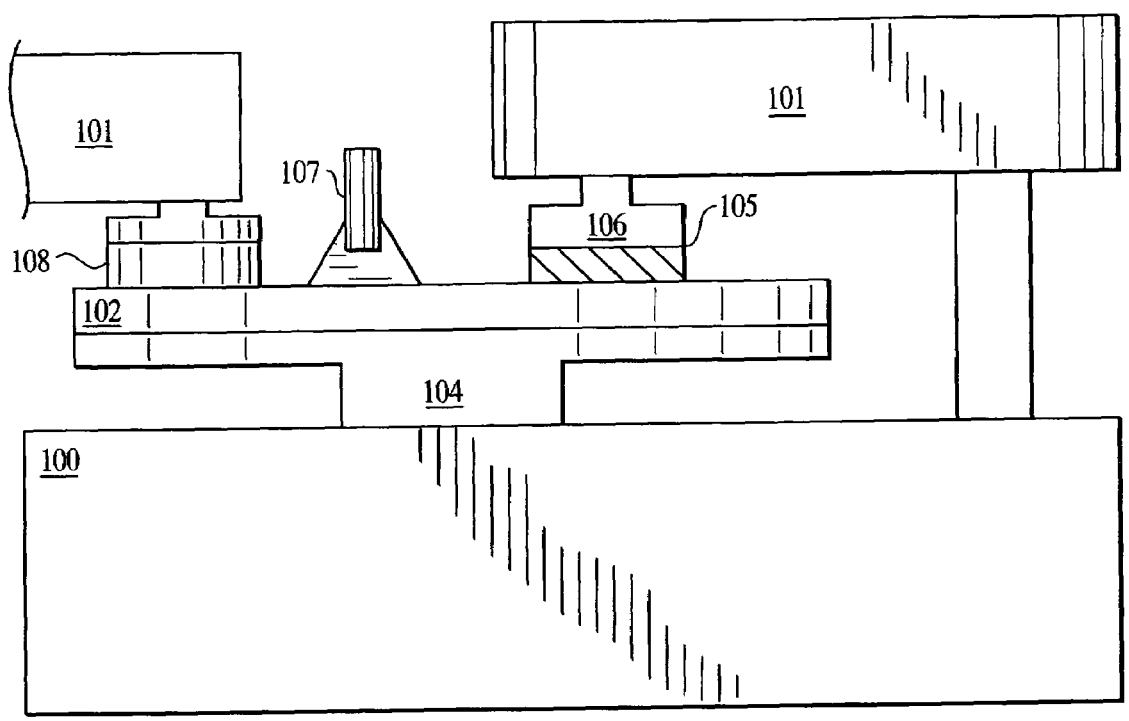
Figure 2:
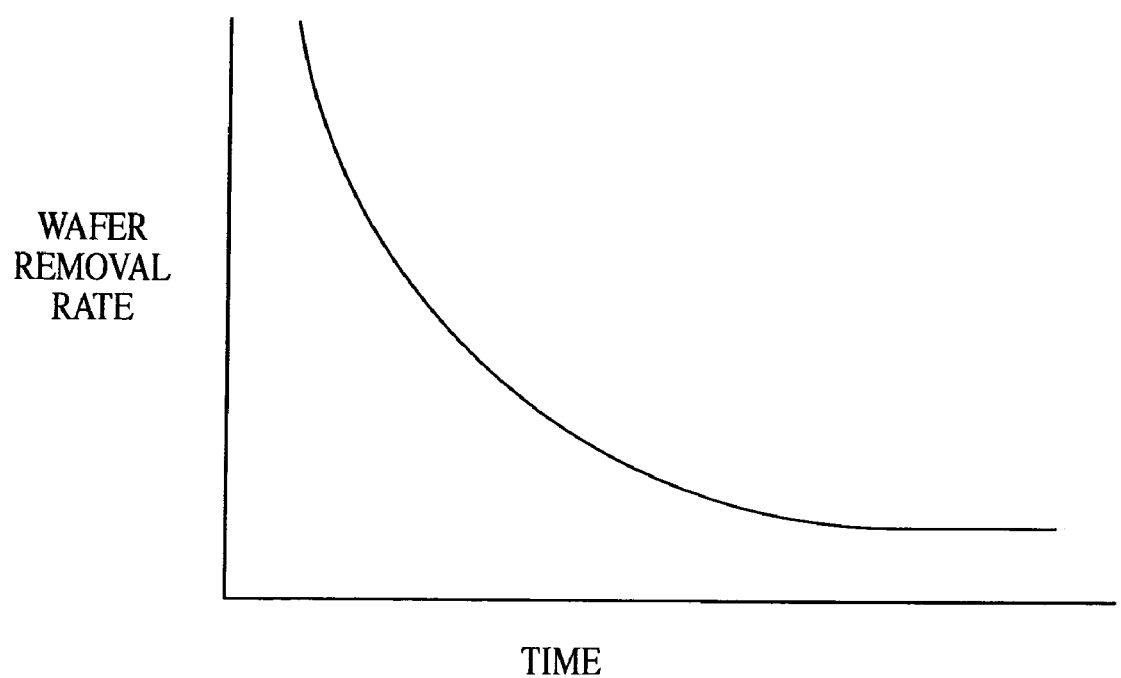
FIG. 2 shows the exponential decay of wafer material removal rate and the equilibrium state of the removal rate that occurs between FIGS. 3B and 3C.
Figure 3A:
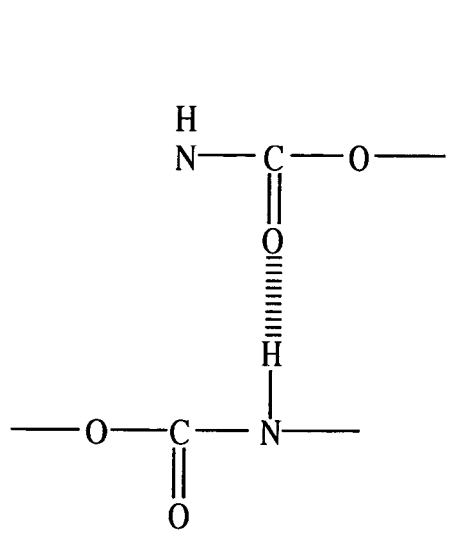
FIGS. 3A-C show the chemical reactions that occur between a polishing pad and a polishing slurry.
Figure 3B:
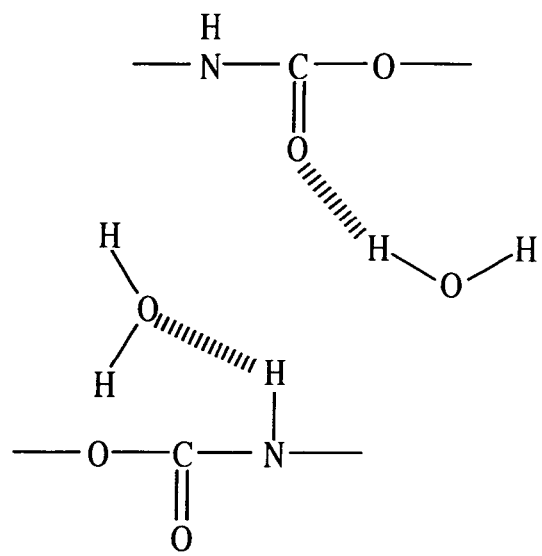
Figure 3C:
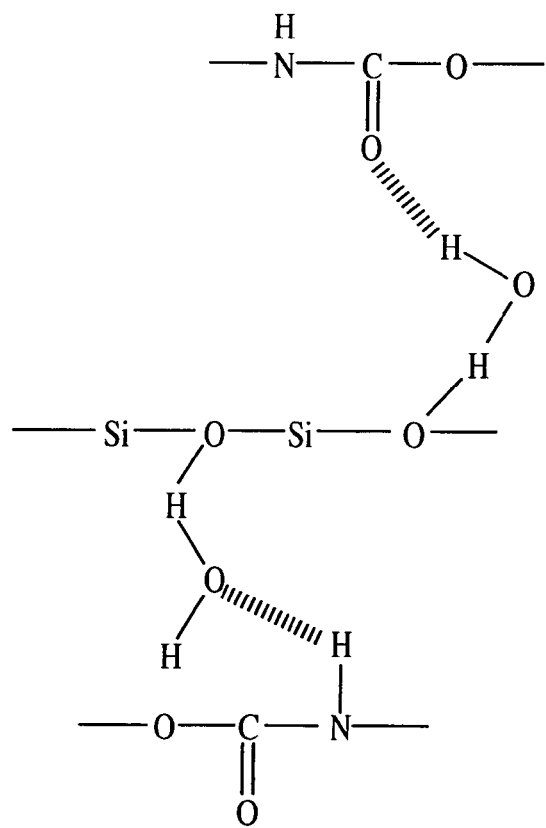

Most CMP pad materials comprise urethane or other polymers, which softens when exposed to water. Chemical reactions relating to the pads, shown in FIGS. 3A, 3B and 3C, explain the process by which softening may occur. In particular, the isocyanate (NCO) groups in the urethane of a brand new pad are normally cross-linked through hydrogen bonding, as shown in FIG. 3A. As water from the polishing slurry contacts the pad, the water interrupts hydrogen bonding in the cross-linked urethane structure, and forms hydrogen bonds with the urethane, as shown in FIG. 3B. When water replaces the cross-linked urethane structure, the pad becomes softer. Moreover, the structure in FIG. 3B may react with the silica ($SiO_2$) (from material removed from the polishing process) in the slurry to create additional hydrogen bonds with the NCO groups in the urethane pad, as shown in FIG. 3C. The pad becomes "poisoned" as a result of the silica chemically reacting with the urethane structure. As water evaporates from the slurry, the silica hardens the pad. The hydrogen bonding of the slurry component and the pad blocks the mean free path of slurry movement in the pad and decreases the active contact areas between the wafers and the pad, so that removal rate of the wafer and surface uniformity decreases in the resulting polished wafers. FIG. 2 shows that the removal rate decreases over time in view of the equilibrium that occurs in the chemical reactions shown in FIGS. 3B and 3C. Once equilibrium is reached, the pad poisoning will stop.

Figure 4A:
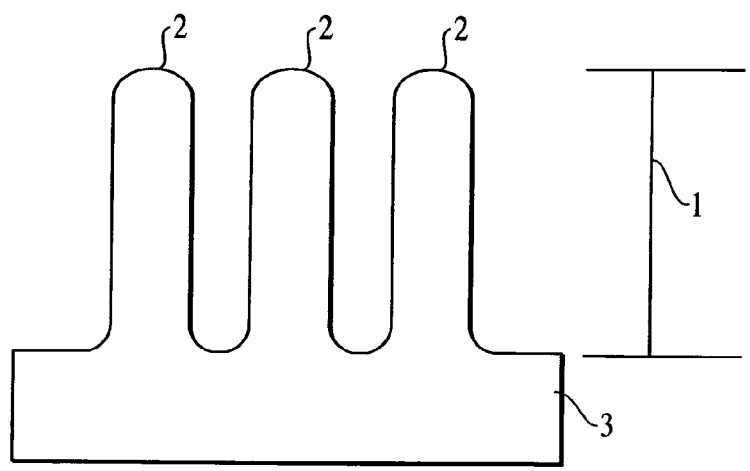
FIGS. 4A-C are cross-sectional diagrams of polishing pads.
Figure 4B:
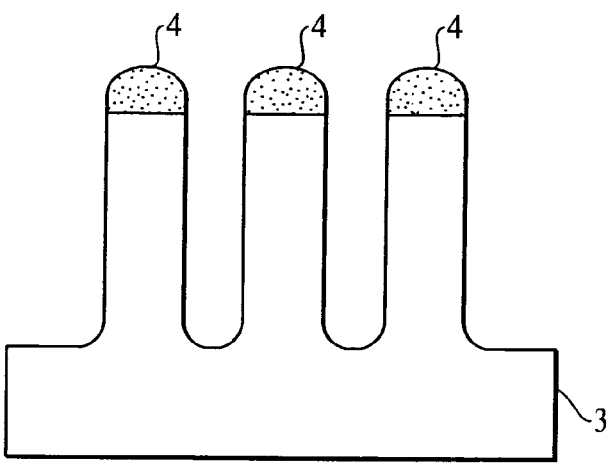
Figure 4C:
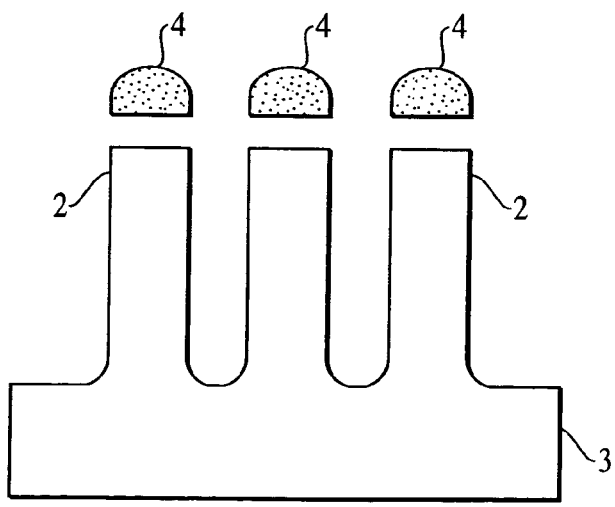

FIGS. 4A, 4B and 4C are simplified models showing pad conditioning. As shown in FIG. 4A, the height (or depth) 1 of the active pad sites 2 is assumed to be equivalent to the life of the pad 3. As the height 1 decreases, the expected further life of the pad 3 decreases. The poisoned areas 4 of the pad 3 in FIG. 4B occur at equilibrium, and are chemically represented by FIGS. 2B and 2C. The poisoned area 4 is generally physically removed, as shown in FIG. 4C, by pad conditioning, so that fresh, active sites 2 will again be exposed. The process shown in FIGS. 4A, 4B and 4C are repeated for the entire life cycle of the pad until no more active sites are available.

The chemical and mechanical processes described above during planarization and conditioning of the polishing pad provide a model for optimization of the planarization process. By using this model, the pad life can be extended without compromise to the wafer material removal rate by adjusting the conditioning parameters during wafer polishing. In particular, conditioning disk down forces (F) and conditioning disk rotational (or angular) velocity (rpm), and optionally other conditioning parameters, for example, conditioning frequency, disk translation speed, and duration of conditioning, are adjusted during the polishing operation in a feedback and feedforward loop that predicts and then optimizes pad conditioning operating parameters.

Figure 5:
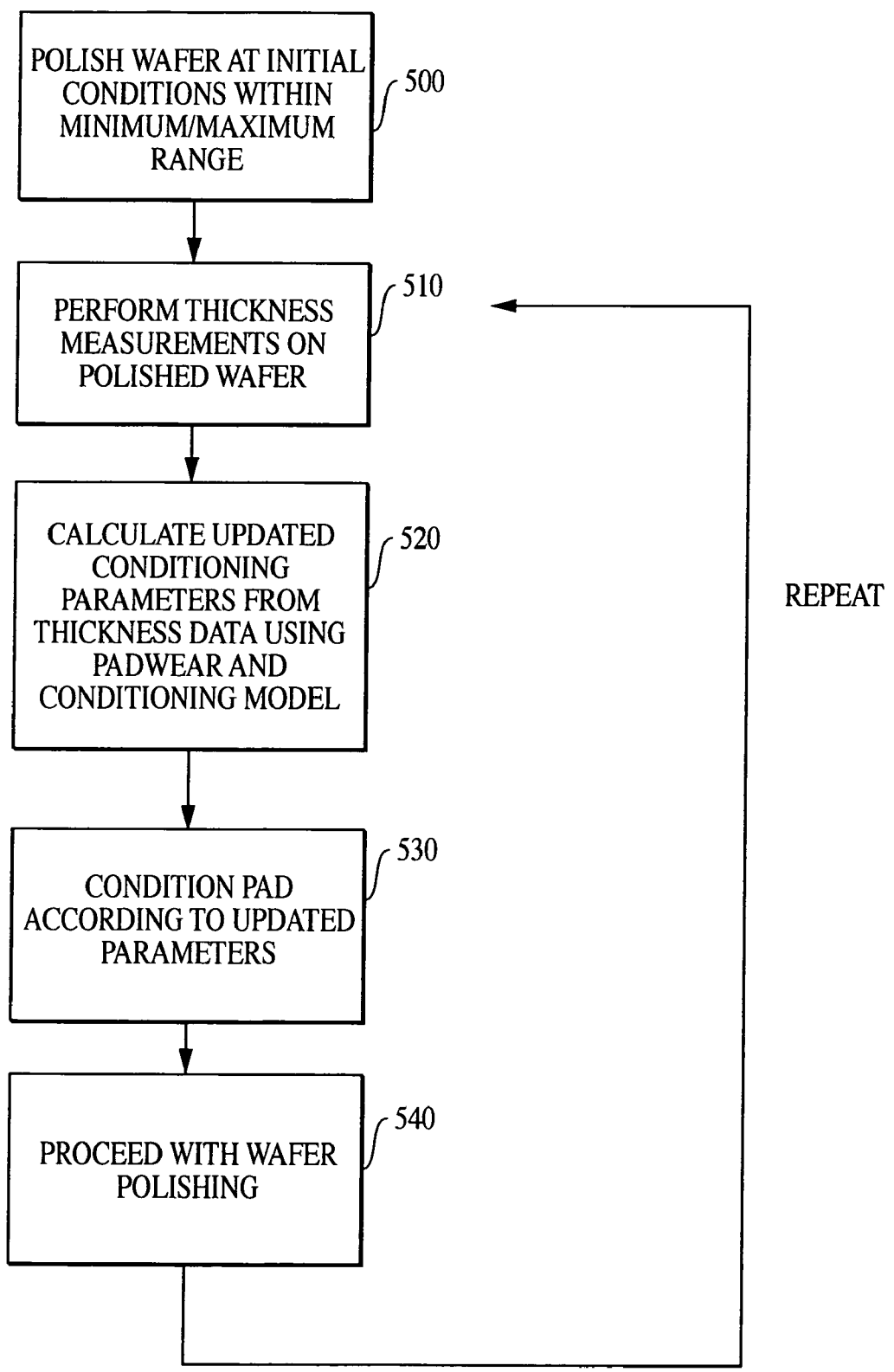
FIG. 5 is a flow diagram of the feedback loop used in CMP process optimization.

According to at least some embodiments of the present invention, an initial model is developed based upon knowledge of the wafer polishing process, and is used in at least some embodiments of the present invention, as is shown in a flow diagram (FIG. 5). Based on that initial model for a given wafer polishing recipe, e.g. the wafer and polishing pad parameters remain constant, initial processing conditions are identified that will provide a wafer material removal rate between a preselected minimum and maximum value for a given set of conditioning parameters, hereinafter, the "acceptable" range for wafer material removal rates. The conditions are selected to prevent overconditioning of the pad. In step 500, wafers are polished according to the given wafer polishing recipe using the initial pad conditioning parameters. The thickness of the polished wafer is measured and a wafer material removal rate is calculated in step 510, which information is then used in a feedback loop to maintain the wafer material removal rate within the accepted range. The actual removal rate is compared with the predicted removal rate (derived from the pad wear model). Deviations, i.e., prediction errors, are used to calculate pad conditioning parameters in step 520 according to the model of the invention to compensate for the reduced polishing capability of the polishing pad as identified in the model and/or to correct for any un-modeled effects. The polishing pad is conditioned according to the updated conditioning parameters in step 530. Polishing is repeated in step 540 and the polishing results are used to further update the polishing conditions by repeating steps 510-530.

By maintaining the wafer material removal rate and conditioning parameters within the preselected minimum and maximum range, overconditioning of the pad is prevented, that is, conditioning parameters are sufficient to restore polishing pad effectiveness, but do not unduly damage the pad. In operation, it may be desirable to select pad conditioning parameters that result in wafer material removal rates that are close to the minimum acceptable rates, as these conditioning forces are less aggressive and therefore are more likely to avoid overconditioning of the polishing pad. However, one should be cautious (or at least cognizant) about operating too closely to the minimum removal rate since a sudden degradation in the pad condition may cause the wafer material removal rate to drop below the minimum acceptable rate.

As indicated previously, conventional art CMP processes do not change the conditioning down force (i.e., the pressure exerted by the conditioning disk on the pad) or the rotational speed uniformly across the surface, e.g., from conditioning event to conditioning event, where a single conditioning event can be, e.g., the conditioning of the entire polishing pad or a portion of the polishing pad that is in contact with the wafer during polishing. By applying a "one size fits all" approach to pad conditioning parameters, the conventional processes overcompensate, thereby removing more pad material than is necessary and accelerating pad wear. The invention thus provides far more optimal conditioning parameters.

Pad conditioning optimization is carried out with reference to a specific polishing system. That is, the conditions which improve pad lifetime are specific to the type of wafer being polished, the slurry used in polishing and the composition of the polishing pad. Once a wafer/slurry/polishing pad system is identified, the system is characterized using the models developed and as discussed herein. Exemplary polishing pad and wafer parameters include polishing pad size, polishing pad composition, slurry composition, wafer composition, rotational velocity of the polishing pad, polishing pad pressure and rotational and translational velocity of the wafer.

In at least some embodiments of the present invention, it is envisioned that a separate model (or at least a supplement to a composite model) is created for each slurry/polishing pad wafer combination (i.e., for each different type/brand of slurry and each type/brand of pad that may be used in production with a given type of wafer).

Figure 6:
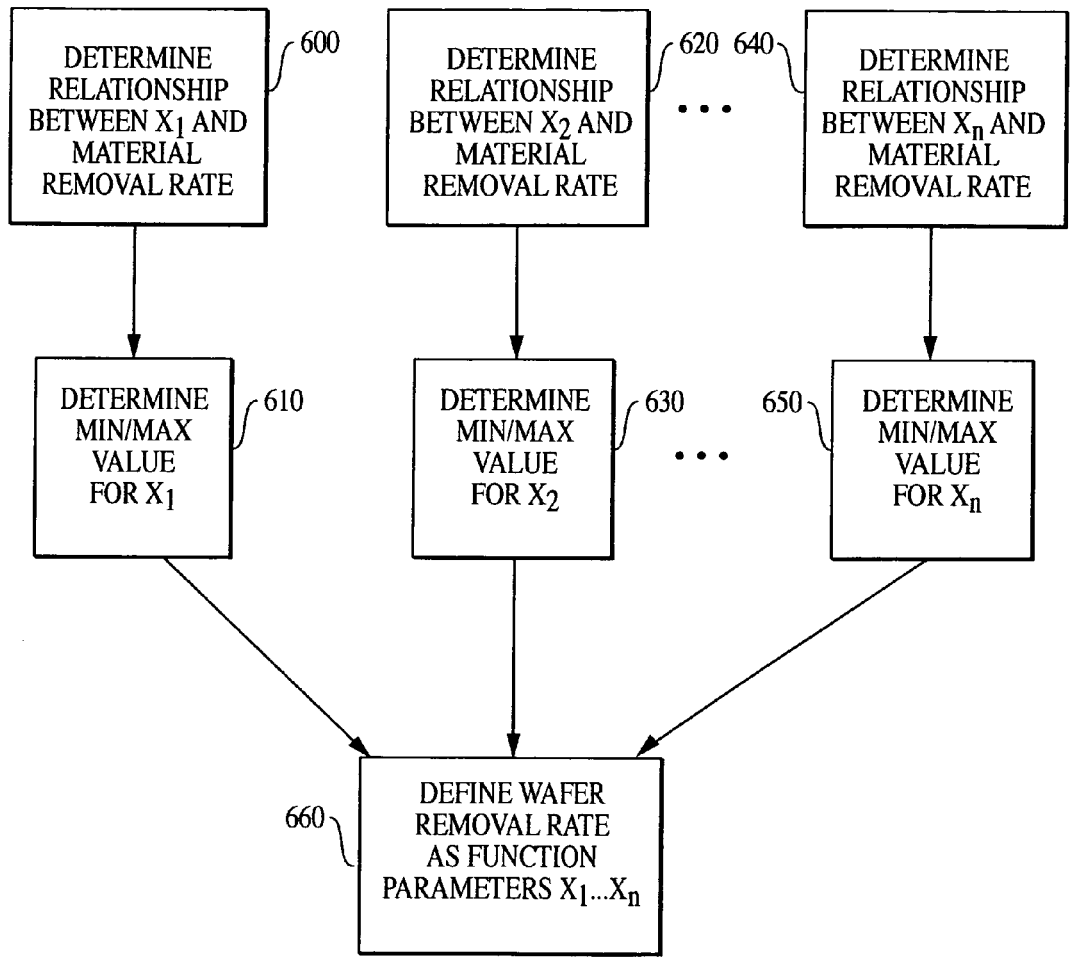
FIG. 6 is a flow diagram illustrating data collection and generation of a pad wear and conditioning model.
Figure 10:
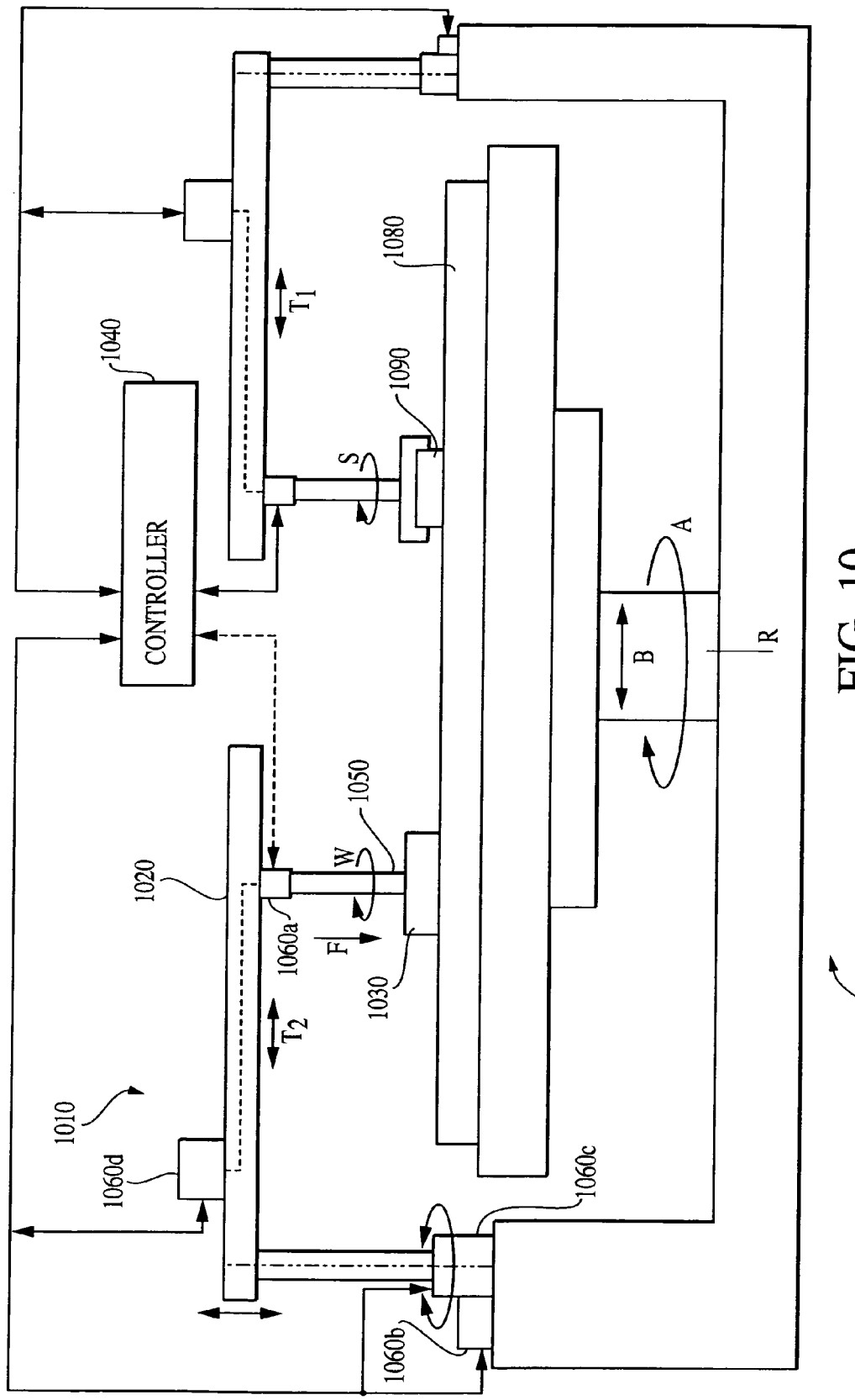
FIG. 10 is a side sectional view of a CMP machine for use in the method of at least some embodiments of the present invention.

FIG. 6 shows a flow diagram of the steps used in developing the pad wear and conditioning model in at least some of the embodiments of the invention. In a first step 600 of the model development as contemplated by at least some embodiments of the present invention, the relationship between wafer material removal rate and a first conditioning parameter $x_1$, e.g., conditioning disk down force ($F_{disk}$), is determined in the selected polishing system. The relationship is determined by measuring wafer material removal rates at different conditioning down forces with wafer parameters such as polishing force, polishing duration, etc., held constant. Thus, a wafer may be polished under specified conditions, e.g., for a specified time and at specified polishing pad and wafer speeds and the rate of material removal may be determined. Pad conditioning and wafer polishing (the "polishing event") may be carried out simultaneously, i.e., using an apparatus such as shown in FIG. 10, or pad conditioning may be followed by wafer polishing. The conditioning down force is increased incrementally from wafer to wafer (or thickness measurement to thickness measurement) with all other parameters held constant, and the wafer removal rate is again determined. A curve as shown in FIG. 7 is generated, which illustrates the effect of the conditioning disk down force on the wafer's material removal rate for a given polishing system (all other parameters being held constant).

Figure 7:
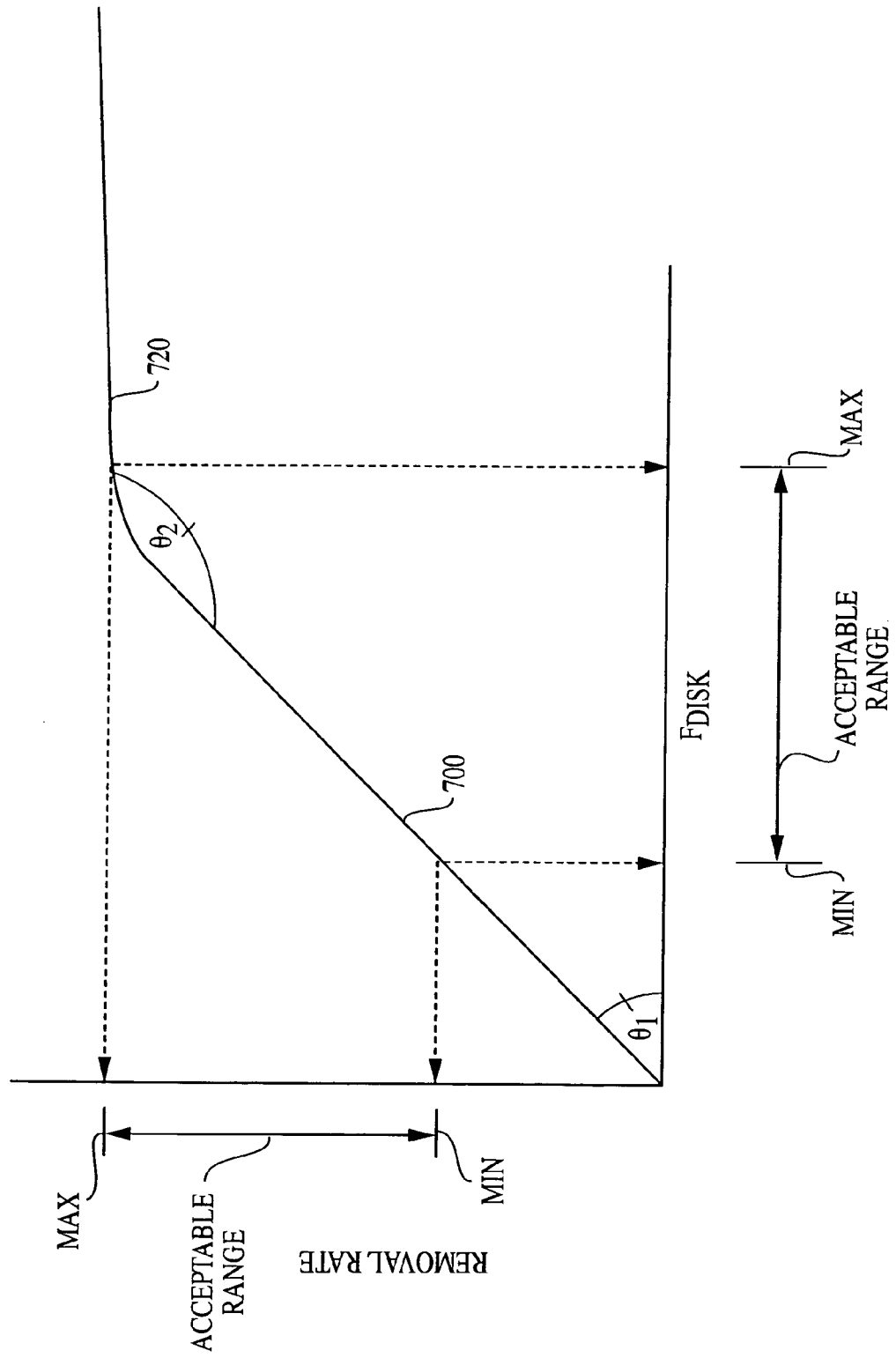
FIG. 7 is a graph generally showing the wafer material removal rate in view of the pressure exerted by the conditioning disk on the polishing pad.

With reference to FIG. 7, in a first portion of the curve 700, the slope exhibits a linear response to a change in down force and is characterized by the angle $\theta_1$. The value for $\theta_1$ is descriptive of the response of the polishing process to conditioning down force. The larger the value for $\theta_1$, the steeper the slope of the curve and the more sensitive the planarization process is to conditioning down force. In a second region of the curve 720, the curve flattens and becomes substantially non-responsive to increases in conditioning down force. This is referred to as the saturation point. The onset of saturation is described by the angle $\theta_2$. The larger the value for $\theta_2$, the more gradual the onset of saturation (poisoning).

Minimum and maximum values for the model variables are determined in step 610 of FIG. 6. The saturation point identifies the maximum (or substantially the maximum) removal rate for this polishing system where all other polishing parameters are held constant. It likewise identifies a maximum conditioning down force, since additional pressure overconditions the pad and does not substantially improve polishing rate. A minimum material removal rate is dictated by production goals, since a minimal wafer throughput rate is needed. Thus the minimal conditioning down force is also defined based on throughput. Once minimum and maximum values for conditioning down force are defined, the range is divided into n steps, e.g. n equal steps, which encompass the acceptable working range for conditioning down forces. The value for n is selected so that a step in value, e.g., from x to x+1, is meaningful, for use in updating model parameters in a feedback control algorithm.

Figure 8:
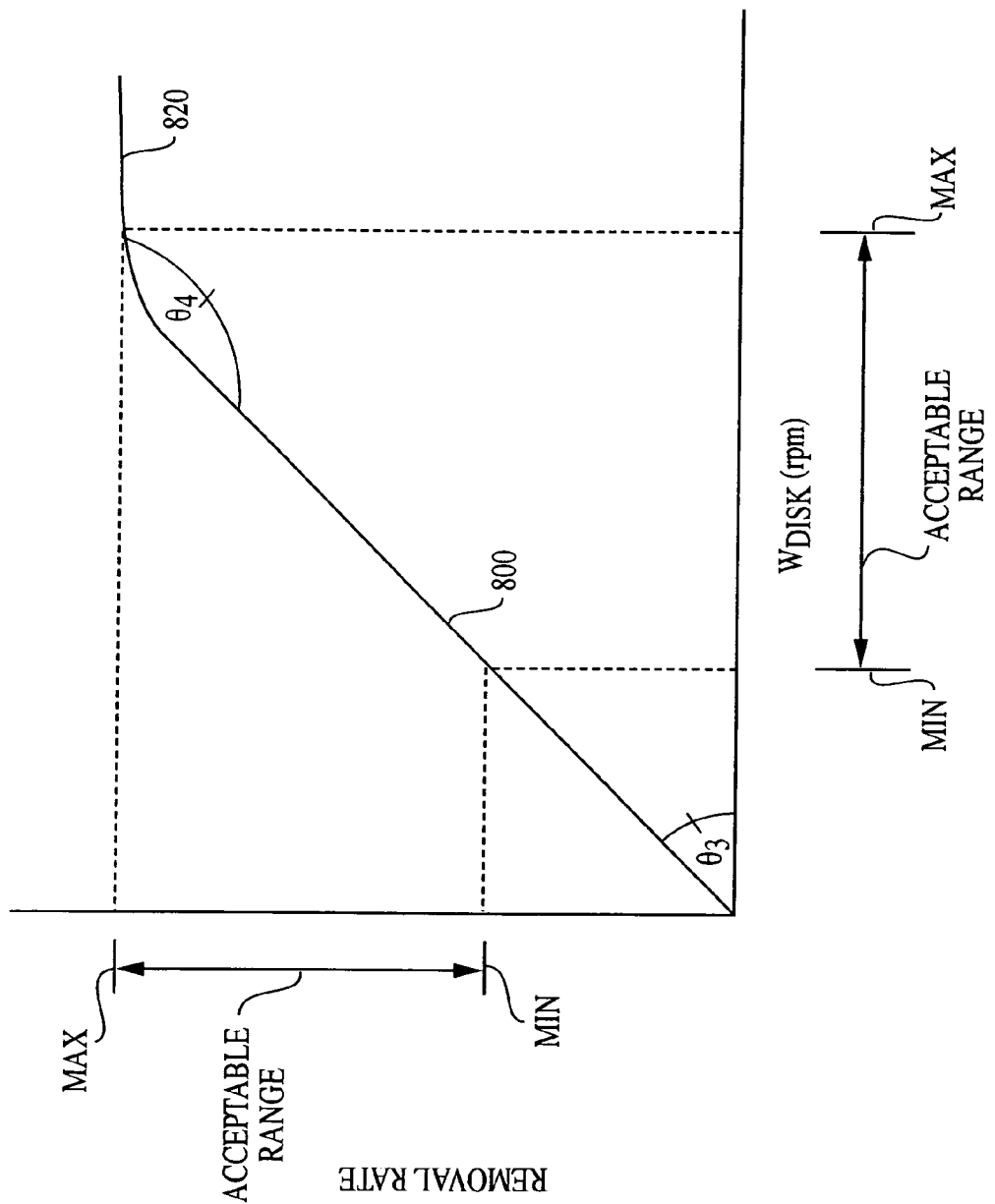
FIG. 8 is a graph generally showing the wafer material removal rate in view of the rotational speed exerted by the conditioning disk on the polishing pad.

In step 620, as contemplated by at least some embodiments of the present invention, the relationship between wafer material removal rate and a second conditioning parameter $x_2$, e.g., conditioning disk rotational velocity, is determined in the same polishing system in the manner described above for conditioning down force. With reference to FIG. 8, a curve can be generated to illustrate the effect of the pad rotation velocity on the wafer material removal rate (all other parameters held constant). Again, the applied rotation velocity is increased incrementally and the wafer material removal rate is measured for each polishing event. The region 800 exhibits a linear response to a change in pad rotation velocity and is characterized by the angle $\theta_3$. In region 820, the curve flattens and becomes substantially non-responsive to increases in rotational rate. This is referred to as the saturation point and is described by the angle $\theta_4$. In step 630 of FIG. 6, the maximum wafer material removal rate and maximum rotational rate are defined by the saturation point for this polishing system, where all other polishing parameters are held constant. The minimum rotation rate is determined by the production-established minimum wafer material removal rate, e.g., it is based on a through put consideration. As above for conditioning down forces, the acceptable range for disk rotational velocity may be divided into m steps, e.g. of equal value, for use in updating model parameters in a feedback control algorithm.

The models provide maximum and minimum wafer material removal rates, maximum and minimum pad down forces, and maximum and minimum pad rotational rates. In addition, values for constants $\theta_1$-$\theta_4$ are determined. Although the above designs of experiment show a conditioning parameter that demonstrates an increase in wafer removal rate with increase in magnitude of the parameter, it is understood that the opposite relationship can exist, so that the minimal parameter value produces the maximum wafer removal rate. The models can be adjusted accordingly. Maximum and minimum conditions may be determined for any combination of polishing pad, wafer and polishing slurry known in the art. Additional pad conditioning parameters, up to $x_1$, may be included in the model and their minimum and maximum values determined as indicated by steps 640 and 650.

The model can be represented as raw data that reflects the system, or it can be represented by equations, for example multiple input-multiple output linear, quadratic and non-linear equations, which describe the relationship among the variables of the system. Feedback and feedforward control algorithms can be constructed in step 660 based on the above models using various methods. The algorithms can be used to optimize parameters using various methods, such as recursive parameter estimation. Recursive parameter estimation is used in situations such as these, where it is desirable to model on line at the same time as the input-output data is received. Recursive parameter estimation is well-suited for making decisions on line, such as adaptive control or adaptive predictions. For more details about the algorithms and theories of identification, see Ljung L., *System Identification —Theory for the User, Prentice Hall*, Upper Saddle River, N.J. 2nd edition, 1999.

The wear and reconditioning of the polishing pad may be modeled by eq. 1:

$$\text{PadLife} = f(F_{disk}, \omega_{disk}, t_{conditioning}, f, T_2) \tag{1}$$

where $F_{disk}$ is the down force applied by the conditioning disk to the polishing pad during conditioning, $\omega_{disk}$ is the angular velocity (rotational speed, e.g., rpm) of the conditioning disk during conditioning of the polishing pad, t is the conditioning time, and f is frequency of conditioning, and $T_2$ is the sweeping speed of the conditioning holder as shown in the example CMP device of FIG. 10 (which will also be described in greater detail below). The pad may be conditioned in a separate step or while the wafer is polished, as is shown in FIG. 10. Frequency is measured as the interval, e.g., number of wafers polished, between conditioning events. For example, a frequency of 1 means that the pad is conditioned after every wafer, while a frequency of 3 means that the pad is conditioned after every third wafer. The sweeping speed is the speed at which the conditioning disk moves across the surface of the polishing pad. The motion is indicated by arrow $T_2$ in FIG. 10. For the purposes of initial investigation, it is assumed in at least some embodiments of the present invention that t (time), $T_2$ (sweep speed), and f (frequency) are held constant.

In at least some embodiments of the present invention, the wafer material removal rate is modeled according to eq. 2:

$$\text{RemovalRate}]_{min}^{max} = f(F_{disk}]_{min}^{max}, \omega_{disk}]_{min}^{max}, f]_{min}^{max}, t_{conditioning}, \theta_1, \theta_2, \theta_3, \theta_4, T_2) \tag{2}$$

where $F_{disk}$, $\omega_{disk}$, f, $t_{conditioning}$, $T_2$, $\theta_1$, $\theta_2$, $\theta_3$, $\theta_4$ are defined above. The objective function is to maintain removal rates within the minimum and maximum allowable rates (the "acceptable rates") by controlling the conditioning disk down forces, the rpm of the disk and, optionally, by controlling other factors such as frequency and duration of conditioning, and speed of translation of the conditioning disk across the pad surface, $T_2$.

Figure 9:
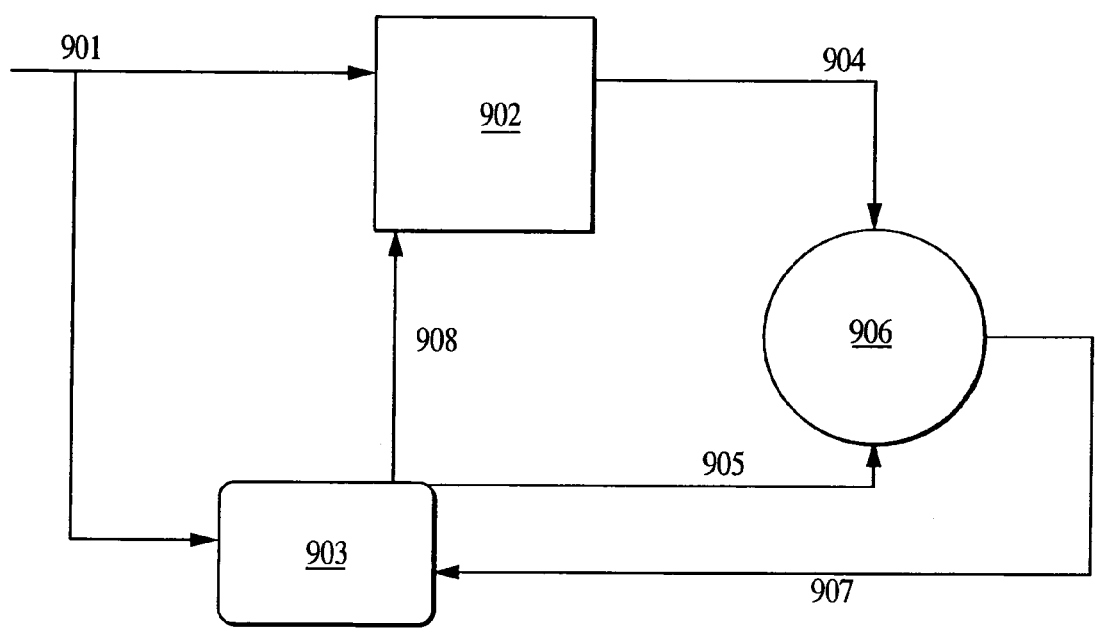
FIG. 9 is a model based on FIGS. 7 and 8 for predicting and modulating the removal rate for the next wafer removal.

The CMP parameters (variables) and constants from the model may then be programmed into a computer, which may then constantly monitor and appropriately vary the parameters during the process to improve the wafer material removal rate and the pad life, as shown in FIG. 9. Parameters from the base study 901 are input into the computer or other controller 902, which runs the wafer polishing process, and the estimator 903, which monitors and modifies the process parameters. The actual output (i.e., measured removal rate) 904 is monitored and compared to the predicted output (i.e., target removal rate) 905 calculated by estimator 903. The difference 906 between the actual output 904 and the predicted output 905 is determined and reported 907 to the estimator 903, which then appropriately generates updated parameters 908 for the process 902. Updating model parameters for feedback control is based on eq. 3.

$$k = (k_1) + g^*(k - (k_1)), \tag{3}$$

where k is a current parameter, $k_1$ is previous parameter estimate, g is the estimate gain and $(k-(k_1))$ is the prediction error. Estimate gain is a constant selected by the user, which is a measure of machine error or variability. Gain factor may be determined empirically or by using statistical methods.

By way of example, a series of curves may be generated for a polishing system of interest as described above for determining the relationship between wafer material removal rate and conditioning down force and conditioning disk rotational velocity. Curves are generated using a standard polishing procedure, with all polishing pad and wafer conditions held constant with the exception of the parameter(s) under investigation. Exemplary polishing pad and wafer parameters that are held constant include polishing pad size, polishing pad composition, wafer composition, polishing time, polishing force, rotational velocity of the polishing pad, and rotational velocity of the wafer. The parameters under investigation include at least the conditioning down force and the angular velocity of the conditioning disk. As is shown in greater detail in the analysis that follows, additional parameters may be incorporated into the model. Using curves generated as in FIGS. 7 and 8 and model development as shown in FIG. 6, values for $\theta_1$-$\theta_4$, minimum and maximum values for wafer material removal rate, conditional down force and conditioning disk rotational velocity are determined. An algorithm that models the wafer planarization is defined, and a first set of pad conditioning parameters may be determined for the polishing system of interest either empirically, using historical data or from the model.

An algorithm which models the pad wear and pad recovery process is input into the estimator and a predicted wafer material removal rate is calculated based upon the model. The actual results are compared against the predicted results and the error of prediction is fed back into the estimator to refine the model. New conditioning parameters are then determined. Based upon the models described herein, these parameters are just sufficient to reactivate the pad surface without overconditioning. Thus, the smallest increment in conditioning parameters that meet the model criteria is selected for the updated conditioning parameters. Subsequent evaluation of the updated model will determine how good is the fit, and further modifications can be made, if necessary, until the process is optimized.

In at least some embodiments of the present invention, the conditioning parameters are updated in discrete increments or steps, defined by way of example, by the incremental curves shown in FIGS. 7 and 8. A suitable number of curves are generated so that steps are small enough to permit minor adjustments to the conditioning parameters.

Also, in at least some embodiments of the present invention, the updated conditioning parameters may be determined by interpolation to the appropriate parameters, which may lie between curves. Interpolation may be appropriate in those instances where a fewer number of curves are initially generated and the experimental results do not provide a fine resolution of the parameters.

While deviations from the predicted rate reflects, in part, the inability of the model to account for all factors contributing to the process (this may be improved with subsequent iterations of the feedback process), deviations from the predicted wafer material removal rate over time represent a degradation in CMP pad polishing. By identifying and modifying the pad conditioning process to account for these temporal changes in polishing performance, optimal wafer material removal rates are maintained without overconditioning of the condition pads, e.g., by operating below the saturation point of the system.

An additional feature of the method is the use of gain factor to qualify the prediction error, as shown in eq. 3. Thus, the method suggests that the model need not correct for 100% of the deviation from predicted value. A gain factor may be used to reflect uncertainty in the measured or calculated parameters, or to "damp" the effect of changing parameters too quickly or to a too great an extent. It is possible, for example, for the model to overcompensate for the prediction error, thereby necessitating another adjustment to react to the overcompensation. This leads to an optimization process that is jumpy and takes several iterations before the optimized conditions are realized. Use of a gain factor in updating the parameters for feedback control qualifies the extent to which the model will react to the prediction error.

Once the basic system is understood and optimized, it is possible to empirically vary other conditioning operating parameters and access their impact on pad conditioning and wafer polishing. A parameter, which had been set to a constant value in the initial study, can be increased (or decreased). The system is monitored to determine the effect this change has on the system. It should be readily apparent that other factors relevant to pad wear and conditioning may be evaluated in this manner. For example, conditioning frequency, which may be set to 1 in the initial study, may be increased to 2 (every second wafer), 3 (every third wafer), etc.

The system is monitored to determine where degradation starts and the process can be backed off to just before this point. The greater the interval between conditioning events, the longer the pad lifetime. Maximizing this interval without loss of polishing quality is contemplated as a feature of the method of the invention.

It should be readily apparent that other factors relevant to pad wear and conditioning may be evaluated in this manner, either empirically or by mathematical modeling. By way of example, conditioning time (residence time of the disk on the pad), conditioning disk translational speed, and the like may be investigated in this manner.

It is envisioned that at least some embodiments of the present invention may be practiced using a device 1000 such as the one shown in FIG. 10. The apparatus has a conditioning system 1010 including a carrier assembly 1020, a conditioning disk 1030 attached to the carrier assembly, and a controller 1040 operatively coupled to the carrier assembly to control the down force (F) and rotation rate ($\omega$) of the conditioning disk. The carrier assembly may have an arm 1050 to which the conditioning disk 1030 is attached and means 1060*a-d* to move the conditioning disk in and out of contact with the planarizing surface. For example, the controller 1040 may be operatively coupled to the moving means to adjust the height and position of the arm carrying the conditioning disk (1060*a*, 1060*b*, 1060*c*, 1060*d*). Similar controls for control of the position and movement of the wafer may also be present. In operation, the controller adjusts the operating parameters of the conditioning disk, e.g., down force and rotation rate, in response to changes in wafer material removal rate. The controller may be computer controlled to automatically provide conditioning according to the calculated conditioning recipe. Thus, the apparatus provides a means for selectively varying the pad conditioning parameters over the operating life of the pad 1080 in order to extend pad life without compromise to the planarization process of the wafer 1090. Other types of devices where, e.g., other components have their height, positions, and/or rotations adjusted are also contemplated by at least some embodiments of the present invention.

Additional apparatus utilized to implement the feedforward and feedback loop include a film thickness measurement tool to provide thickness data needed to calculate wafer material removal rate. The tool may be positioned on the polishing apparatus so as to provide in-line, in situ measurements, or it may be located remote from the polishing apparatus. The tool may use optical, electrical, acoustic or mechanical measurements methods. A suitable thickness measurement device is available from Nanometrics (Milpitas, Calif.) or Nova Measuring Instruments (Phoenix, Ariz.). A computer may be utilized to calculate the optimal pad conditioning recipe based upon the measured film thickness and calculated removal rate, employing the models and algorithm provided according to the invention. A suitable integrated controller and polishing apparatus (Mirra with iAPC or Mirra Mesa with iAPC) is available from Applied Materials, California.

Exemplary semiconductor wafers that can be polished using the concepts discussed herein including, but are not limited to those made of silicon, tungsten, aluminum, copper, BPSG, USG, thermal oxide, silicon-related films, and low k dielectrics and mixtures thereof.

The invention may be practiced using any number of different types of conventional CMP polishing pads. There are numerous polishing pads in the art which are generally made of urethane or other polymers. However, any pad which can be reconditioned can be evaluated and optimized using the invention herein. Exemplary polishing pads include Epic™ polishing pads (Cabot Microelectronics Corporation, Aurora Ill.) and Rodel® IC1000, IC1010, IC1400 polishing pads (Rodel Corporation, Newark, Del.), OXP series polishing pads (Sycamore Pad), Thomas West Pad 711, 813, 815, 815-Ultra, 817, 826, 828, 828-E1 (Thomas West).

Furthermore, any number of different types of slurry can be used in the methods of the invention. There are numerous CMP polishing slurries in the art, which are generally made to polish specific types of metals in semiconductor wafers. Exemplary slurries include Semi-Sperse® (available as Semi-Sperse® 12, Semi-Sperse® 25, Semi-Sperse® D7000, Semi-Sperse® D7100, Semi-Sperse® D7300, Semi-Sperse® P1000, Semi-Sperse® W2000, and Semi-Sperse® W2585) (Cabot Microelectronics Corporation, Aurora Ill.), Rodel ILD1300, Klebesol series, Elexsol, MSW1500, MSW2000 series, CUS series and PTS (Rodel).

An example of the algorithm for calculating the conditioning recipe from wafer material removal rate data may be defined as:

$$\hat{y}_i = \rho_i x_i + I_i, \quad (4)$$

where $\hat{y}_i$ is the wafer material removal rate for the conditioning parameter $x_i$, $\rho_i$ is the slope and $I_i$ is the intercept of the curve of the defining the relationship between $\hat{y}_i$ and $x_i$. Letting $x_1=F_{disk}$, $x_2=\omega_{disk}$, $x_3=f$, $x_4=t_{conditioning}$, and $x_5=T_2$, the following relationships may be established from the model:

$$\hat{y}_1 = \rho_1 x_1 + I_1 \text{ for } N_i \leq x_1 \leq N_{i+k}; \quad (5)$$

$$\hat{y}_2 = \rho_2 x_2 + I_2 \text{ for } N_j \leq x_2 \leq N_{j+k}; \quad (6)$$

$$\hat{y}_3 = \rho_3 x_3 + I_3 \text{ for } N_k \leq x_3 \leq N_{k+k}; \quad (7)$$

$$\hat{y}_4 = \rho_4 x_4 + I_4 \text{ for } N_l \leq x_4 \leq N_{l+k}; \quad (8)$$

$$\hat{y}_5 = \rho_5 x_5 + I_5 \text{ for } N_m \leq x_5 \leq N_{m+k}; \quad (9)$$

where $\hat{y}$ is the predicted removal rate, $\rho$ is the slope and I is the intercept in each equation. N and $N_+$ represent the upper and lower boundary conditions for a particular pad conditioning parameter. Models of the invention may include all or a subset of these pad conditioning parameters.

Each of the pad conditioning factors contributing to wafer material removal rate may be combined in a single equation, which defines the weighted contribution of each factor to the wafer material removal rate. The wafer material removal rate may be defined by eq. 10, $$\hat{y} = W_1 \hat{y}_1 + W_2 \hat{y}_2 + W_3 \hat{y}_3 + W_4 \hat{y}_4 + W_5 \hat{y}_5, \quad (10)$$

where $W_i$ is a weighing factor and $W_T = W_1 + W_2 + W_3 + W_4 + W_5$. The weighing factors are determined by minimizing any penalties, e.g., materials defects, nonuniformity of deposition, etc., that are associated with $x_i$ for satisfying $\hat{y}$ in eq. 10. The penalty function may be determined empirically or by using historical data.

The prediction error for wafer material removal rate, $\Delta\hat{y}$, is the difference between the predicted removal rate, $\hat{y}$, and the measured removal rate, y, shown in eq. 11.

$$\Delta\hat{y} = y - \hat{y} \quad (11)$$

The prediction error is used to generate an updated wafer material removal rate, $\hat{y}_{i+}$. The new predictor based upon the feedback eq. 12 will be:

$$\hat{y}_{i+} = \sum_i \rho_i x_i + \sum_i I_i + \sum_i \frac{W_i}{W_T} \cdot \Delta\hat{y}, \quad (12)$$

and optimized parameter $x_{i+}$ is determined by eq. 13.

$$x_{i+} = \frac{\hat{y}_{i+} - I_i - \frac{W_i}{W_T} \cdot \Delta\hat{y}}{\rho_i}, \quad (13)$$

where $\hat{y}_{i+}$ is the target wafer material removal rate.

The optimized parameters are used to update the new CMP polishing recipe that is sent to the tool for use in subsequent polishing steps. Thus, the model is able to adapt as more data is received to improve the process without any external control over the process.

The present invention is described above under conditions where wafer polishing parameters are held constant. However the methodology can also be used together with an optimization engine when the wafer polishing parameters are changing through an optimization engine.

In at least some embodiments, pad conditioning optimization may be carried out together with optimization of wafer polishing. This can be accomplished through optimization by having the optimization search engine's objective function minimize a function that describes both polishing and conditioning parameters.

Assuming n number of polishing parameters to be changed during the wafer polishing, N1, N2, N3 ... Nn, and y number of control parameters, Y1, Y2, Yy, then $$S = W_{N1}(N1_{previous} - N1_{current})^2 + W_{N2}(N2_{previous} - N2_{current})^2 + \ldots W_{Nn}(Nn_{previous} - Nn_{current})^2 + W_F (F_{previous} - F_{current})^2 + W_\omega(\omega_{previous} - \omega_{current})^2 + W_{Y1} (Y1_{previous} - Y1_{current})^2 + W_{Y2} (Y2_{previous} - Y2_{current})^2 + W_{Yy}(Yy_{previous} - Yy_{current})^2,$$

where $W_x$ is a weighing factor for parameter x (e.g., N1, N2, Y1, Y1, F, etc.), F is the conditioning down force and ω is the pad rotational velocity. Other pad conditioning parameters can be included in the function. The optimization process then seeks to minimize S. Thus, the method of the present invention can be used under conditions when the polishing parameters are held constant or when the polishing parameters are to be changed through optimization.

Figure 11:
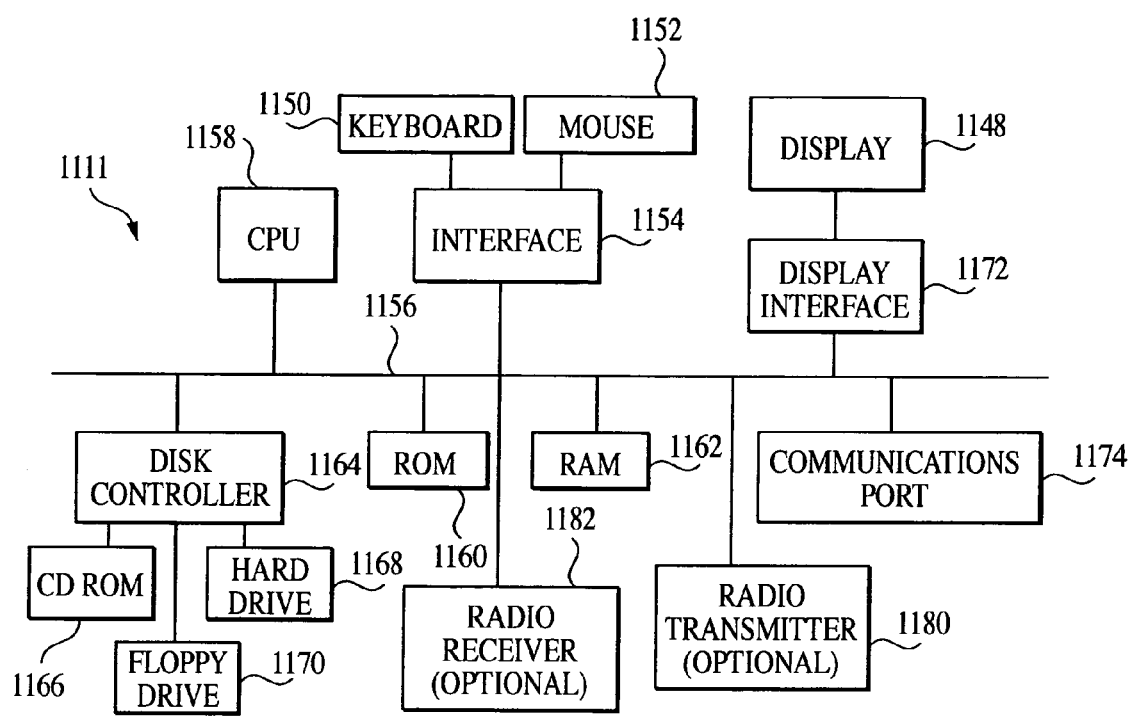
FIG. 11 is a block diagram of a computer system that includes tool representation and access control for use in at least some embodiments of the invention.

Various aspects of the present invention that can be controlled by a computer, including computer or other controller 902, can be (and/or be controlled by) any number of control/computer entities, including the one shown in FIG. 11. Referring to FIG. 11 a bus 1156 serves as the main information highway interconnecting the other components of system 1111. CPU 1158 is the central processing unit of the system, performing calculations and logic operations required to execute the processes of embodiments of the present invention as well as other programs. Read only memory (ROM) 1160 and random access memory (RAM) 1162 constitute the main memory of the system. Disk controller 1164 interfaces one or more disk drives to the system bus 1156. These disk drives are, for example, floppy disk drives 1170, or CD ROM or DVD (digital video disks) drives 1166, or internal or external hard drives 1168. These various disk drives and disk controllers are optional devices.

A display interface 1172 interfaces display 1148 and permits information from the bus 1156 to be displayed on display 1148. Display 1148 can be used in displaying a graphical user interface. Communications with external devices such as the other components of the system described above can occur utilizing, for example, communication port 1174. Optical fibers and/or electrical cables and/or conductors and/or optical communication (e.g., infrared, and the like) and/or wireless communication (e.g., radio frequency (RF), and the like) can be used as the transport medium between the external devices and communication port 1174. Peripheral interface 1154 interfaces the keyboard 1150 and mouse 1152, permitting input data to be transmitted to bus 1156. In addition to these components, system 1111 also optionally includes an infrared transmitter and/or infrared receiver. Infrared transmitters are optionally utilized when the computer system is used in conjunction with one or more of the processing components/stations that transmits/receives data via infrared signal transmission. Instead of utilizing an infrared transmitter or infrared receiver, the computer system may also optionally use a low power radio transmitter 1180 and/or a low power radio receiver 1182. The low power radio transmitter transmits the signal for reception by components of the production process, and receives signals from the components via the low power radio receiver. The low power radio transmitter and/or receiver are standard devices in industry.

Although system 1111 in FIG. 11 is illustrated having a single processor, a single hard disk drive and a single local memory, system 1111 is optionally suitably equipped with any multitude or combination of processors or storage devices. For example, system 1111 may be replaced by, or combined with, any suitable processing system operative in accordance with the principles of embodiments of the present invention, including sophisticated calculators, and hand-held, laptop/notebook, mini, mainframe and super computers, as well as processing system network combinations of the same.

Figure 12:
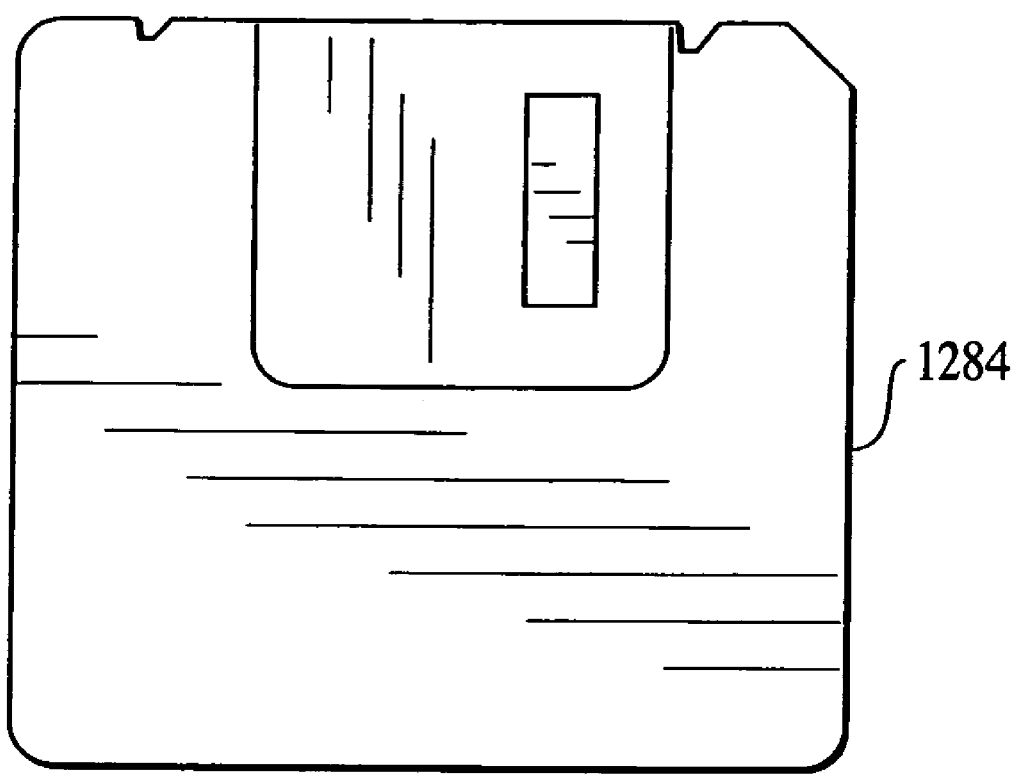
FIG. 12 is an illustration of a floppy disk that may store various portions of the software according to at least some embodiments of the invention.

FIG. 12 is an illustration of an exemplary computer readable memory medium 1284 utilizable for storing computer readable code or instructions. As one example, medium 1284 may be used with disk drives illustrated in FIG. 11. Typically, memory media such as floppy disks, or a CD ROM, or a digital video disk will contain, for example, a multi-byte locale for a single byte language and the program information for controlling the above system to enable the computer to perform the functions described herein. Alternatively, ROM 1160 and/or RAM 1162 illustrated in FIG. 11 can also be used to store the program information that is used to instruct the central processing unit 1158 to perform the operations associated with the instant processes. Other examples of suitable computer readable media for storing information include magnetic, electronic, or optical (including holographic) storage, some combination thereof, etc. In addition, at least some embodiments of the present invention contemplate that the medium can be in the form of a transmission (e.g., digital or propagated signals).

In general, it should be emphasized that the various components of embodiments of the present invention can be implemented in hardware, software or a combination thereof. In such embodiments, the various components and steps would be implemented in hardware and/or software to perform the functions of the present invention. Any presently available or future developed computer software language and/or hardware components can be employed in such embodiments of the present invention. For example, at least some of the functionality mentioned above could be implemented using the C, C++, or any assembly language appropriate in view of the processor(s) being used. It could also be written in an interpretive environment such as Java and transported to multiple destinations to various users.

Although various embodiments which incorporate the teachings of the present invention have been shown and described in detail herein, those skilled in the art can readily devise many other varied embodiments that incorporate these teachings.

What is claimed is:

1. An apparatus for conditioning polishing pads used to planarize substrates by the removal of material from the substrates, the apparatus comprising:
    a carrier assembly having an arm positionable over a planarizing surface of a polishing pad;
    a conditioning disk attached to the carrier assembly;
    an actuator capable of controlling one or more pad conditioning operating parameters for a conditioning process that uses the conditioning disk; and
    a controller operatively coupled to the actuator, to operate the actuator to adjust the pad conditioning operating parameters for the conditioning process according to a function of a pad wear and conditioning model having the pad conditioning operating parameters, wherein minimum and maximum values for each pad conditioning operating parameter are determined based on acceptable wafer material removal rates.

2. The apparatus of claim 1, wherein the pad conditioning operating parameters comprise conditioning down force.

3. The apparatus of claim 2, wherein the pad conditioning operating parameters comprise rotational velocity of the conditioning disk.

4. The apparatus of claim 2, wherein the pad conditioning operating parameters comprise one or more parameters selected from the group consisting of rotational velocity of the conditioning disk, frequency of conditioning, duration of conditioning and translational speed of the conditioning disk.

5. The apparatus of claim 1, wherein the wafer material removal rates are determined according to the equation:

$$\hat{y}_i = \rho_i x_i + I_i,$$

where $\hat{y}_i$ is a wafer material removal rate for a pad conditioning operating parameter $x_i$, $\rho_i$ is a slope and $I_i$ is an intercept of a curve defining a relationship between $\hat{y}_i$ and $x_i$.

6. The apparatus of claim 5, wherein the updated pad conditioning parameter, $x_{i+}$, is determined by solving the equation:

$$x_{i+} = \frac{\hat{y}_{i+} - I_i - \frac{W_i}{W_T} \cdot \Delta \hat{y}}{\rho_i},$$

where $\hat{y}_{i+}$ is the target wafer material removal rate, $W_i$ is the weighing factor for a pad conditioning operating parameter $x_i$, $W_T = \Sigma W_i$, and $\Delta \hat{y}$ is a prediction error for wafer material removal rate.

7. The apparatus of claim 1, wherein the pad conditioning operating parameters are updated for feedback control according to the equation:

$$k = (k_1) + g^*(k - (k_1)),$$

where k is a current pad conditioning operating parameter, $k_1$ is a previous pad conditioning operating parameter estimate, g is an estimate gain, and $(k-(k_1))$ is a prediction error.

8. The apparatus of claim 1, wherein the pad conditioning operating parameters are calculated based on a difference between an estimated wafer material removal rate as an output of the function of the pad wear and conditioning model and a measured wafer material removal rate.

9. The apparatus of claim 1, wherein the pad conditioning operating parameters are adjusted without the use of a measured pad thickness or a measured pad uniformity.

10. The apparatus of claim 1, wherein the pad wear and conditioning model is optimized for a combination of a distinct type of wafer, a distinct slurry, and a distinct polishing pad composition.

11. A computer readable medium comprising instructions being executed by a computer, the instructions including a computer-implemented software application for conditioning polishing pads used to planarize substrates by the removal of material from the substrates, the instructions comprising:

receiving data from a chemical mechanical polishing tool relating to a wafer material removal rate of at least one wafer processed in a chemical mechanical polishing process;

calculating, from the received data, one or more pad conditioning operating parameters for a conditioning process that uses a conditioning disk, according to a function of a pad wear and conditioning model having the pad conditioning operating parameters, wherein maximum and minimum values for each pad conditioning operating parameter are determined based on acceptable wafer material removal rates; and operating an actuator to execute the conditioning process using the calculated pad conditioning operating parameters.

12. The computer readable medium of claim 11, wherein the pad conditioning operating parameters comprise conditioning down force.

13. The computer readable medium of claim 11, wherein the pad conditioning operating parameters comprise rotational velocity of the conditioning disk.

14. The computer readable medium of claim 11, wherein the pad conditioning operating parameters comprise one or more parameters selected from the group consisting of rotational velocity of the disk, frequency of conditioning, duration of conditioning and translational speed of the conditioning disk.

15. The computer readable medium of claim 11, wherein the pad conditioning operating parameters are updated according to the equation:

$$k = (k_1) + g*(k - (k_1)),$$

where k is a current pad conditioning operating parameter, $k_1$ is a previous pad conditioning operating parameter estimate, g is an estimate gain, and $(k-(k_1))$ is a prediction error.

16. The computer readable medium of claim 11, wherein the function of the pad wear and conditioning model is defined according to the equation:

$$\text{PadLife} = f(F_{disk}, \omega_{disk}, t_{conditioning}, f, T_2),$$

where PadLife means a life of a polishing pad, $F_{disk}$ is a down force applied by the conditioning disk to the polishing pad during conditioning, $\omega_{disk}$ disk is an angular velocity of the conditioning disk during conditioning, $t_{conditioning}$ is a time of conditioning, f is a frequency of conditioning, and $T_2$ is a sweeping speed of the conditioning disk during conditioning.

17. The computer readable medium of claim 11, wherein the wafer material removal rates are defined by the equation:

$$\text{RemovalRate}]_{min}^{max} = f(F_{disk}]_{min}^{max}, \omega_{disk}]_{min}^{max}, f]_{min}^{max}, t_{conditioning}]_{min}^{max}, T_2]_{min}^{max}],$$

where $F_{disk}$ is a down force applied by the conditioning disk to a polishing pad during conditioning, $\omega_{disk}$ is an angular velocity of the conditioning disk during conditioning, $t_{conditioning}$ is a time of conditioning, f is a frequency of conditioning, and $T_2$ is a sweeping speed of the conditioning disk during conditioning.

18. The computer readable medium of claim 11, wherein the wafer material removal rates are determined according to the equation:

$$\hat{y}_i \rho_i x_i + I_i,$$

where $\hat{y}_i$ is a wafer material removal rate for a pad conditioning operating parameter $x_i$, $\rho_i$ is a slope and $I_i$ is an intercept of a curve defining a relationship between $\hat{y}_i$ and $x_i$.

19. The computer readable medium of claim 18, wherein an updated pad conditioning parameter, $x_{i+}$, is determined by solving the equation:

$$x_{i+} = \frac{\hat{y}_{i+} - I_i - \frac{W_i}{W_T} \cdot \Delta \hat{y}}{\rho_i},$$

where $\hat{y}_{i+}$ is a target wafer material removal rate, $W_i$ is a weighing factor for a pad conditioning operating parameter $x_i$, $W_T = \Sigma W_i$ and $\Delta \hat{y}$ is a prediction error for wafer material removal rate.

20. The computer readable medium of claim 11, wherein the conditioning parameters are adjusted without the use of a measured pad thickness or a measured pad uniformity.

21. The computer readable medium of claim 11, wherein the pad wear and conditioning model is optimized for a combination of a distinct type of wafer, a distinct slurry, and a distinct polishing pad composition.

* * * * *